United States Patent
Kim et al.

(10) Patent No.: US 11,205,683 B2
(45) Date of Patent: Dec. 21, 2021

(54) IMAGE SENSOR

(71) Applicant: SAMSUNG ELECTRONICS CO., LTD., Suwon-si (KR)

(72) Inventors: Kwan Sik Kim, Seoul (KR); Jin Hyung Kim, Hwaseong-si (KR); Chang Hwa Kim, Hwaseong-si (KR); Hong Ki Kim, Hwaseong-si (KR); Sang-Su Park, Seoul (KR); Beom Suk Lee, Seoul (KR); Jae Sung Hur, Yongin-si (KR)

(73) Assignee: SAMSUNG ELECTRONICS CO., LTD.

(*) Notice: Subject to any disclaimer, the term of this patent is extended or adjusted under 35 U.S.C. 154(b) by 0 days.

(21) Appl. No.: 16/787,429

(22) Filed: Feb. 11, 2020

(65) Prior Publication Data
US 2020/0395414 A1    Dec. 17, 2020

(30) Foreign Application Priority Data
Jun. 12, 2019   (KR) .................. 10-2019-0069081

(51) Int. Cl.
| | |
|---|---|
| *H01L 33/00* | (2010.01) |
| *H01L 21/00* | (2006.01) |
| *H01L 27/30* | (2006.01) |
| *H01L 51/44* | (2006.01) |
| *G02B 1/18* | (2015.01) |

(52) U.S. Cl.
CPC .............. *H01L 27/307* (2013.01); *G02B 1/18* (2015.01); *H01L 51/448* (2013.01)

(58) Field of Classification Search
CPC .................... H01L 27/14621; H01L 27/14645
USPC .................. 438/29, 69–70; 257/98, 435, 437
See application file for complete search history.

(56) References Cited

U.S. PATENT DOCUMENTS

| | | | |
|---|---|---|---|
| 8,710,608 B2 | 4/2014 | Maeda et al. | |
| 8,847,297 B2 | 9/2014 | Kim et al. | |
| 9,130,180 B2* | 9/2015 | Park | H01L 31/02162 |
| 10,243,022 B2 | 3/2019 | Lee et al. | |
| 10,497,754 B2* | 12/2019 | Lee | H01L 27/14638 |
| 10,535,715 B2* | 1/2020 | Lee | H01L 27/14687 |
| 10,748,968 B2* | 8/2020 | Kim | H01L 27/14621 |
| 10,784,314 B2* | 9/2020 | Yoo | H01L 31/022466 |
| 10,797,092 B2* | 10/2020 | Lee | H01L 27/14636 |
| 10,804,303 B2* | 10/2020 | Park | H01L 27/14638 |
| 10,872,927 B2* | 12/2020 | Kim | H01L 51/447 |
| 10,910,266 B2* | 2/2021 | Choi | H01L 27/307 |
| 10,916,587 B2* | 2/2021 | Lee | H01L 27/286 |
| 2014/0264695 A1 | 9/2014 | Lee et al. | |
| 2019/0027539 A1 | 1/2019 | Kim et al. | |
| 2020/0083268 A1* | 3/2020 | Kim | H01L 27/1462 |

FOREIGN PATENT DOCUMENTS

SG    10201805041X    2/2019

* cited by examiner

*Primary Examiner* — Calvin Lee
(74) *Attorney, Agent, or Firm* — Myers Bigel, P.A.

(57) ABSTRACT

An image sensor includes a substrate having a photoelectric conversion element therein, a first insulating layer on the substrate, a contact penetrating through the first insulating layer, a color filter on at least one side of the contact, and a moisture absorption prevention layer in contact with a sidewall of the contact and extending on an upper surface of the color filter.

16 Claims, 18 Drawing Sheets

IMAGE SENSOR

CROSS-REFERENCE TO RELATED APPLICATION

This application claims priority to Korean Patent Application No. 10-2019-0069081, filed on Jun. 12, 2019, and all the benefits accruing therefrom under 35 U.S.C. § 119, the disclosure of which is incorporated herein by reference in its entirety.

BACKGROUND

Technical Field

The present disclosure relates to an image sensor.

Description of the Related Art

An image sensor is a device to convert an optical image into an electrical signal. The image sensor may be categorized into a charge coupled device (CCD) type, or a complementary metal oxide semiconductor (CMOS) type. The CMOS type image sensor may be referred to as a 'CIS' (CMOS image sensor). The CIS may include a plurality of 2-dimensionally arranged pixels. Each of the pixels may include a photodiode (PD). The photodiode may be configured to convert an incident light into an electrical signal.

In recent years, according to developments in the computer and the communication industries, demand has increased for the image sensors with enhanced performance in a variety of fields such as digital cameras, camcorders, personal communication systems (PCS), gaming devices, security cameras, medical micro cameras, robots, etc. Further, highly-integrated semiconductor devices have enabled high integration of image sensors.

SUMMARY

An objective to be achieved by the present disclosure is to provide an image sensor which has a moisture absorption prevention layer between a color filter and an organic photoelectric conversion layer to prevent the organic photoelectric conversion layer from being degraded by a material provided from the color filter, thereby enhancing reliability of the image sensor.

According to some embodiments of the present disclosure, there is provided an image sensor, that includes a substrate with a photoelectric conversion element therein, a first insulating layer on the substrate, a contact penetrating through the first insulating layer, a color filter on at least one side of the contact, and a moisture absorption prevention layer in contact with a sidewall of the contact and overlapping an upper surface of the color filter.

According to some embodiments of the present disclosure, there is provided an image sensor, including a substrate with a photoelectric conversion element therein, a color filter on the substrate, a lower electrode overlapping the color filter, a contact on at least one side of the color filter and in contact with the lower electrode, and a moisture absorption prevention layer in contact with a sidewall of the contact and extending along a bottom surface of the lower electrode.

According to some embodiments of the present disclosure, there is provided an image sensor, including a substrate with a first surface and a second surface opposing each other. The substrate includes a photoelectric conversion element therein, an insulating structure on the second surface of the substrate and including a plurality of wire layers, a via penetrating through the substrate, a first insulating layer on the first surface of the substrate, a color filter in the first insulating layer, a contact on at least one side of the color filter and penetrating through the first insulating layer and configured to electrically connect with the via, a moisture absorption prevention layer in contact with a sidewall of the contact, and extending on an upper surface of the color filter. The moisture absorption prevention layer includes a different material from the first insulating layer. The image sensor includes a lower electrode on the moisture absorption prevention layer and electrically connected with the contact, an organic photoelectric conversion layer on the lower electrode, an upper electrode on the organic photoelectric conversion layer, a protection layer on the upper electrode, and a micro lens on the protection layer. An upper surface of the contact is in a same plane as an upper surface of the moisture absorption prevention layer.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail embodiments thereof with reference to the accompanying drawings, in which.

DETAILED DESCRIPTION

An image sensor according to some embodiments of the present disclosure will be described with reference to FIGS. 1 to 5.

Figure 1:
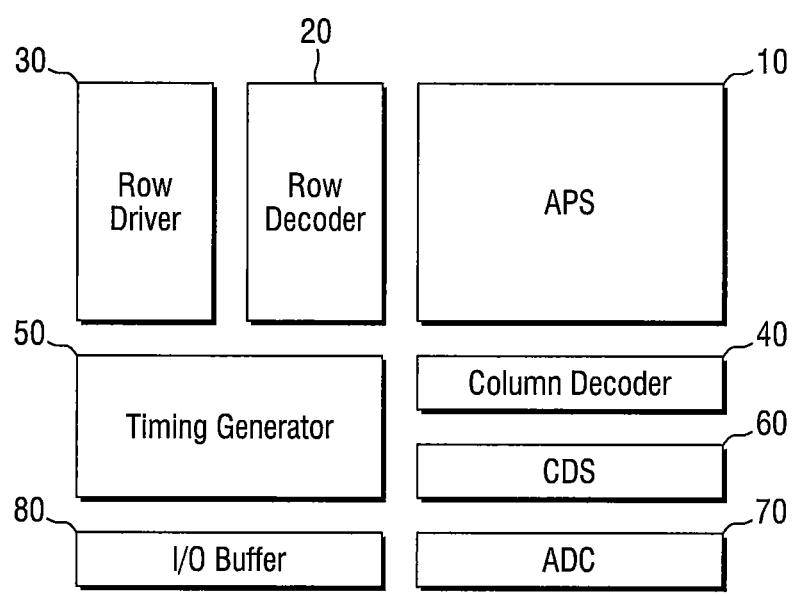
FIG. 1 is a block diagram of an image sensor according to some embodiments of the present disclosure.
Figure 2:
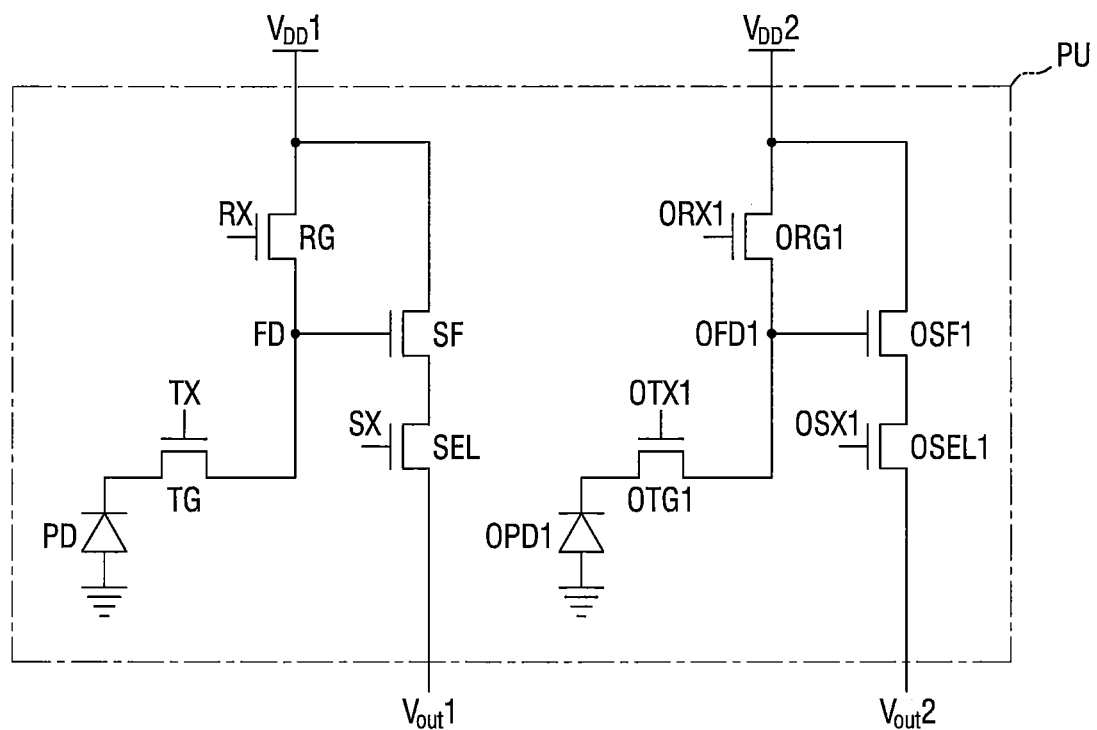
FIG. 2 is a circuit diagram of an example of a unit pixel region of the image sensor according to some embodiments of the present disclosure.
Figure 3:
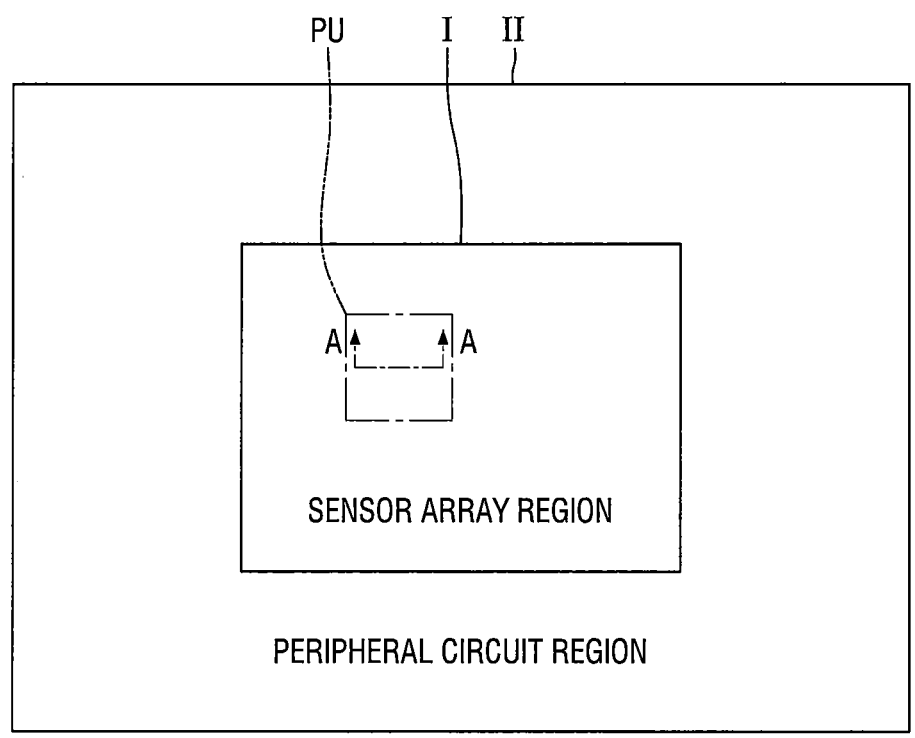
FIG. 3 is a schematic top view of the image sensor according to some embodiments of the present disclosure.
Figure 3:
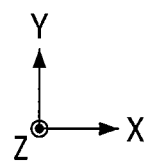
Figure 4:
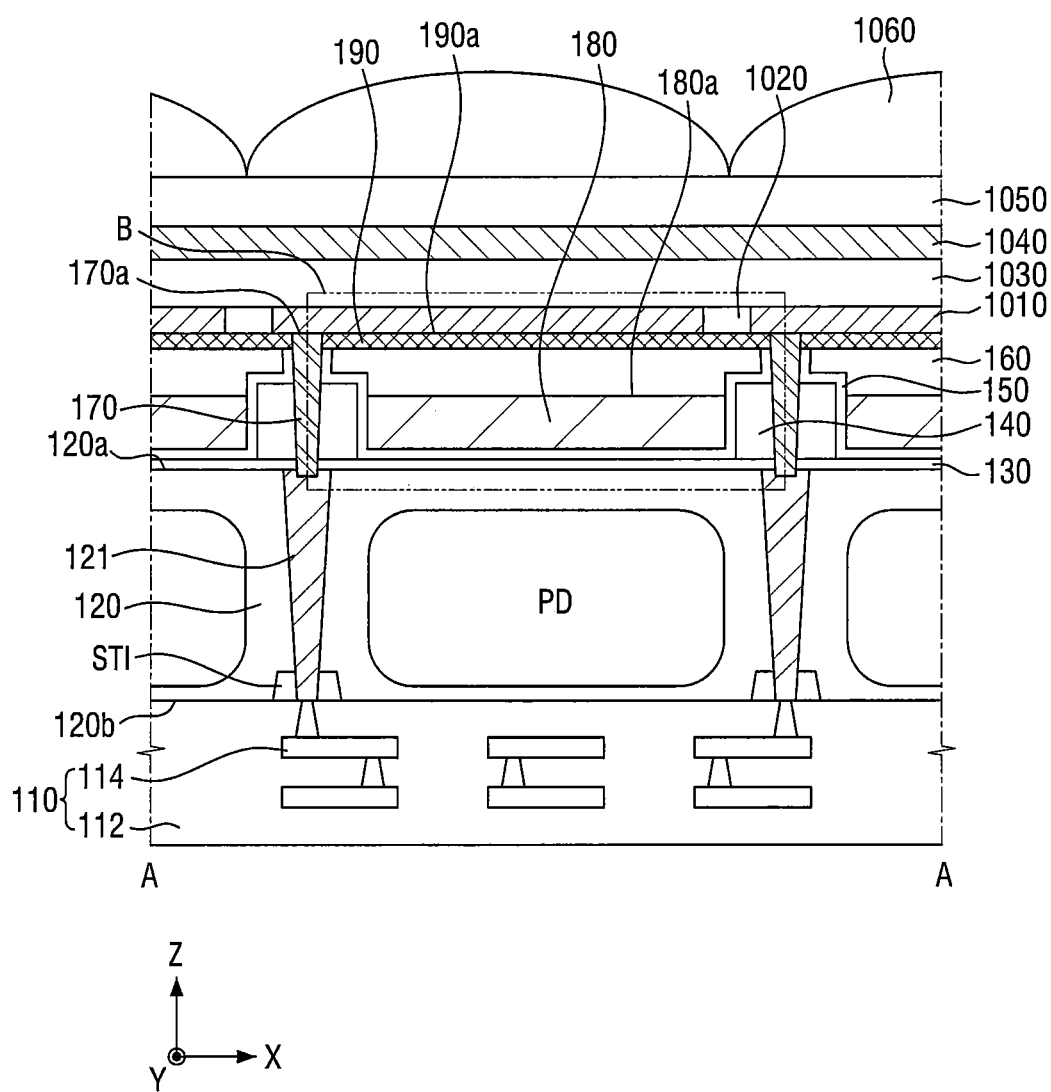
FIG. 4 is a cross-sectional view taken on line A-A of FIG. 3.
Figure 5:
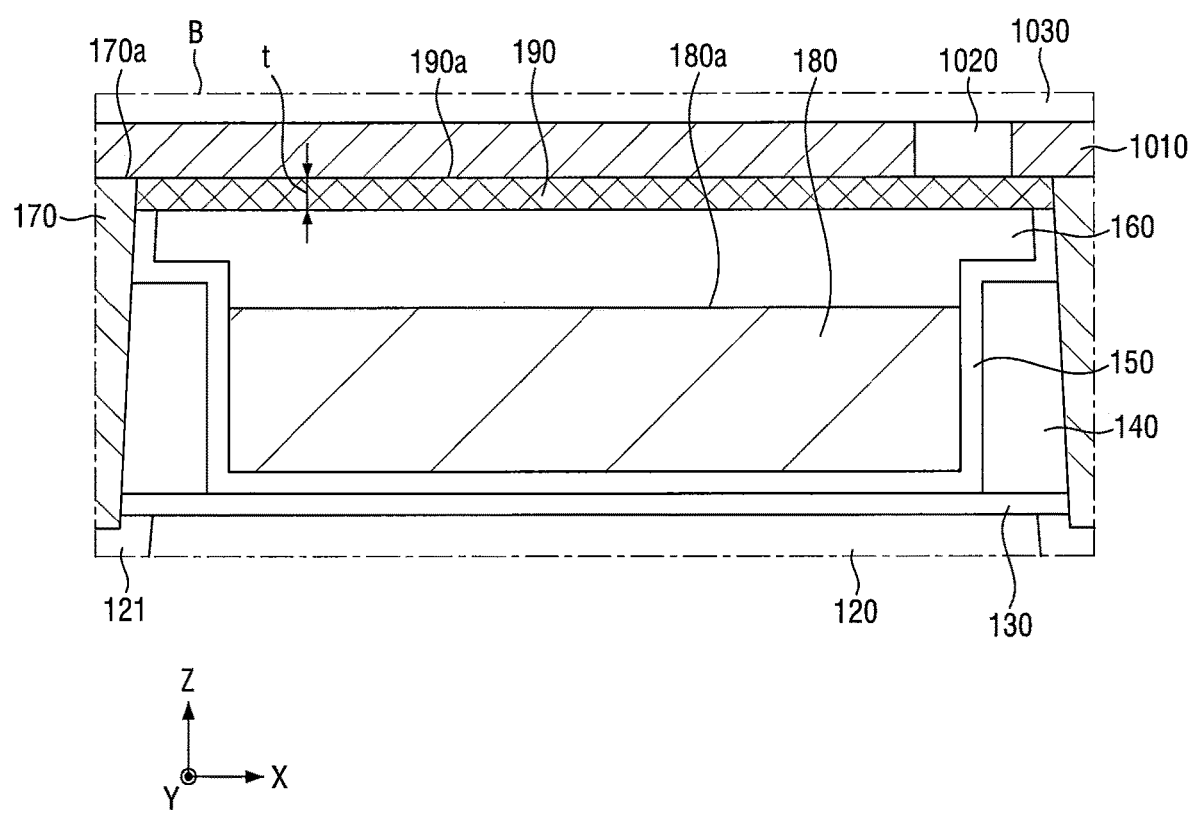
FIG. 5 is a view enlarging a section B of FIG. 4.

FIG. 1 is a block diagram of an image sensor according to some embodiments. FIG. 2 is a circuit diagram of an example of a unit pixel region of the image sensor according to some embodiments. FIG. 3 is a schematic top view of the image sensor according to some embodiments. FIG. 4 is a cross-sectional view taken on line A-A of FIG. 3. FIG. 5 is a view enlarging a section B of FIG. 4.

Referring to FIG. 1, the image sensor according to some embodiments may include an active pixel sensor array (APS) 10, a row decoder 20, a row driver 30, a column decoder 40, a timing generator 50, a correlated double sampler (CDS) 60, an analog to digital converter (ADC) 70, and an input/output (I/O) buffer 80.

The active pixel sensor array 10 may include a plurality of 2-dimensionally arranged unit pixel regions, and may convert an optical signal into an electric signal. The active pixel sensor array 10 may be driven by a plurality of driving signals from the row driver 30, such as a pixel-select signal, a reset signal, and a charger transfer signal. In addition, the electric signal converted by the active pixel sensor array 10 may be provided to the correlated double sampler 60.

The row driver 30 may provide the active pixel sensor array 10 with a plurality of driving signals to drive the plurality of unit pixel regions according to a result of decoding at the row decoder 20. When the unit pixel regions are arranged in the form of a matrix, the driving signals may be provided on a basis of each row.

The timing generator 50 may provide a timing signal and a control signal to the row decoder 20 and the column decoder 40.

The correlated double sampler (CDS) 60 may receive an electric signal generated at the active pixel sensor array 10, and may hold and/or sample the received signal. The correlated double sampler 60 may double-sample a specified noise level and a signal level according to the electric signal, and may output a difference level corresponding to a difference between the noise level and the signal level.

The analog to digital converter (ADC) 70 may convert an analog signal corresponding to the difference level outputted from the correlated double sampler 60 into a digital signal, and output the digital signal.

The I/O buffer 80 may latch the digital signal, and the latched signal may cause the digital signals to be outputted to an image signal processor (not shown) sequentially according to the result of decoding at the column decoder 40.

Referring to FIG. 2, the unit pixel region PU of the image sensor according to some embodiments may include a photoelectric conversion element PD, a first transfer transistor TG, a first floating diffusion region FD, a first reset transistor RG, a first source follower transistor SF, a first select transistor SEL, a first organic photoelectric conversion element OPD1, a second transfer transistor OTG1, a second floating diffusion region OFD1, a second reset transistor ORG1, a second source follower transistor OSF1, and a second select transistor OSEL1.

The photoelectric conversion element PD may absorb light and accumulate charges corresponding to a quantity of light. The photoelectric conversion element PD may include, for example, a photo diode, a photo transistor, a photo gate, a pinned photo diode, an organic photo diode, a quantum dot, and/or a combination thereof.

The photoelectric conversion element PD may be coupled with the first transfer transistor TG which transfers the accumulated charges to the first floating diffusion region FD. The first floating diffusion region FD is a region where the charges are converted into voltages, and because of the parasitic capacitance, the charges may be accumulatively stored.

The first transfer transistor TG may transfer the charges generated from the photoelectric conversion element PD to the first floating diffusion region FD. The first transfer transistor TG may include a transistor which is driven by a transfer line applying a predetermined bias (for example, a first transfer signal TX). When the first transfer transistor TG is turned on by the first transfer signal TX, the charges generated from the photoelectric conversion element PD may be transferred to the first floating diffusion region FD.

The first source follower transistor SF may serve as a source follower buffer amplifier which is controlled by the first floating diffusion region FD. The first source follower transistor SF may amplify a change of an electric potential of the first floating diffusion region FD, and may provide a result of the amplification to a first output line $V_{out}1$. For example, a predetermined electric potential (for example, a first power voltage $V_{DD}1$) provided to a drain of the first source follower transistor SF may be controlled by the first floating diffusion region FD to be provided to the first output line $V_{out}1$.

The first select transistor SEL may select a unit pixel region to be read on a row basis. The first select transistor SEL may include a transistor which is driven by a select line applying a predetermined bias (for example, a first row select signal SX1). For example, when the first select transistor SEL is turned on by the first row select signal SX1, a predetermined electric potential provided to a drain of the first select transistor SEL (for example, an electric potential provided from a source of the first source follower transistor SF) may be outputted to the first output line $V_{out}1$.

The first reset transistor RG may periodically or occasionally reset the first floating diffusion region FD. The first reset transistor RG may include a transistor which is driven by a reset line applying a predetermined bias (for example, a first reset signal RX1). When the first reset transistor RG is turned on by the first reset signal RX1, a predetermined electric potential (for example, the first power voltage $V_{DD}1$) provided to a drain of the first reset transistor RG may be transferred to the first floating diffusion region FD.

The first organic photoelectric conversion element OPD1 may absorb light and accumulate charges corresponding to a quantity of light. The first organic photoelectric conversion element OPD1 may detect light of a different wavelength from that of the photoelectric conversion element PD. For example, the photoelectric conversion element PD may detect red light or blue light, and the first organic photoelectric conversion element OPD1 may detect green light.

The first organic photoelectric conversion element OPD1 may include, for example, an organic photo diode.

The first organic photoelectric conversion element OPD1 may be coupled with the second transfer transistor OTG1 which transfers the accumulated charges to the second floating diffusion region OFD1. The second floating diffusion region OFD1 is a region where the charges are converted into voltages, and because of the parasitic capacitance, the charges may be accumulatively stored.

The second transfer transistor OTG1 may transfer the charges generated from the first organic photoelectric conversion element OPD1 to the second floating diffusion region OFD1. The second transfer transistor OTG1 may include a transistor which is driven by a transfer line applying a predetermined bias (for example, a second transfer signal OTX1). When the second transfer transistor OTG1 is turned on by the second transfer signal OTX1, the charges generated from the first organic photoelectric conversion element OPD1 may be transferred to the second floating diffusion region OFD1.

The second source follower transistor OSF1 may serve as a source follower buffer amplifier which is controlled by the second floating diffusion region OFD1. The second source follower transistor OSF1 may amplify a change of an electric potential of the second floating diffusion region OFD1, and may provide a result of the amplification to a second output line $V_{out}2$. For example, a predetermined electric potential (for example, a second power voltage $V_{DD}2$) provided to a drain of the second source follower transistor OSF1 may be controlled by the second floating diffusion region OFD1 to be provided to the second output line $V_{out}2$.

The second select transistor OSEL1 may select a unit pixel region to be read on a row basis. The second select transistor OSEL1 may include a transistor which is driven by a select line applying a predetermined bias (for example, a second row select signal OSX1). For example, when the second select transistor OSEL1 is turned on by the second row select signal OSX1, a predetermined electric potential provided to a drain of the second select transistor OSEL1 (for example, an electric potential provided from a source of the second source follower transistor OSF1) may be outputted to the second output line $V_{out}2$.

The second reset transistor ORG1 may periodically or occasionally reset the second floating diffusion region OFD1. The second reset transistor ORG1 may include a transistor which is driven by a reset line applying a predetermined bias (for example, a second reset signal ORX1). When the second reset transistor ORG1 is turned on by the second reset signal ORX1, a predetermined electric potential (for example, the second power voltage $V_{DD}2$) provided to a drain of the second reset transistor ORG1 may be transferred to the second floating diffusion region OFD1.

The first transfer signal TX, the first select signal SX, the first reset signal RX, the second transfer signal OTX1, the second select signal OSX1, and/or the second reset signal ORX1 may be outputted from, for example, the row driver 30 of FIG. 1.

Referring to FIG. 3, the image sensor according to some embodiments may include a sensor array region I and a peripheral circuit region II. The peripheral circuit region II may be arranged to surround the sensor array region I on a plane formed in a first direction X and a second direction Y.

The sensor array region I may be a region where the active pixel sensor array 10 of FIG. 1 is formed, for example. The active pixel sensor array 10 of the sensor array region I may include the plurality of unit pixel regions. For example, the active pixel sensor array 10 of the sensor array region I may include the unit pixel region PU of FIG. 2.

The peripheral circuit region II may be a region where the correlated double sampler 60, the analog to digital converter 70, etc. of FIG. 1 are formed. Although FIG. 2 depicts that the peripheral circuit region II surrounds the sensor array region I, the present disclosure is not limited thereto. The peripheral circuit region II may overlap the sensor array region I although it is not illustrated. For example, the peripheral circuit region II may be formed within a lower substrate, and the sensor array region I may be formed within an upper substrate stacked on the lower substrate.

Referring to FIGS. 4 and 5, the image sensor, according to some embodiments, includes a photoelectric conversion element PD, an element separation layer STI, an insulating structure 110, a substrate 120, a via 121, a reflection prevention layer 130, a first insulating layer 140, a liner layer 150, a second insulating layer 160, a contact 170, a color filter 180, a moisture absorption prevention layer 190, a lower electrode 1010, a third insulating layer 1020, an organic photoelectric conversion layer 1030, an upper electrode 1040, a protection layer 1050, and/or a micro lens 1060.

The substrate 120 includes a first surface 120a which is an upper surface, and a second surface 120b which is a lower surface opposing the first surface 120a.

For example, the substrate 120 may use a P-type or N-type bulk substrate, or may use a P-type or N-type epitaxial layer grown on the P-type bulk substrate, or may use a P-type or N-type epitaxial layer grown on the N-type bulk substrate. Further, a substrate other than a semiconductor substrate, such as an organic plastic substrate, may also be used for the substrate 120. The photoelectric conversion element (PD) such as, for example, a photo diode, may be arranged within the substrate 120.

The insulating structure 110 may be arranged on the second surface 120b of the substrate 120. The insulating structure 110 may include a plurality of wire layers 114 and an interlayer insulating film 112 arranged to wrap the respective wire layers 114.

The interlayer insulating film 112 may include, for example, at least one of silicon oxide ($SiO_2$), silicon nitride (SiN), silicon oxynitride (SiON), a low-k dielectric material and/or a combination thereof.

The wire layer 114 may include a plurality of metal wires and a plurality of vias to electrically connect each of metal wires.

For example, the wire layer 114 may include aluminum (Al), copper (Cu), tungsten (W), cobalt (Co), ruthenium (Ru), and/or so on, but the present disclosure is not limited thereto.

The wire layer 114 may include a plurality of wires stacked sequentially and a plurality of vias to electrically connect ones of the wires to one another. Although it is illustrated in FIG. 4 that the wire layer 114 includes two layers stacked sequentially, this is only for convenience of explanation, and thus the present disclosure is not limited thereto.

The via 121 may be arranged to penetrate through the first surface 120a of the substrate 120 in a third direction Z and to extend into the substrate 120 or into other elements in the substrate 120. Although it is illustrated in FIG. 4 that via 121 is extended to the second surface 120b of the substrate 120, the present disclosure is not limited thereto.

At least a part of an upper surface of via 121 may be exposed on the first surface 120a of the substrate 120. Although it is illustrated in FIG. 4 that via 121 is formed as a single film, this is for convenience of explanation, and thus the present disclosure is not limited thereto.

For example, via 121 may include a via conductive film and a via barrier film. The via barrier film may be formed along a sidewall and a bottom surface of a trench formed with the via 121. The via barrier film may include, for example, at least one of silicon oxide ($SiO_2$), silicon nitride (SiN), silicon oxynitride (SiON), a low-k dielectric material and/or a combination thereof.

The via conductive film may be arranged on the via barrier film to fill or partially occupy the trench formed with the via 121. The via conductive film may include poly silicon (Poly-Si), for example, but the present disclosure is not limited thereto.

In some embodiments, the via conductive film may include, for example, at least one of carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), or zirconium (Zr).

The element separation layer STI may be arranged to extend within the substrate 120 from the second surface 120b of the substrate 120. The element separation layer STI may be arranged to surround a sidewall of the via 121, i.e. surround via 121 when viewed from a direction Y. However, the present disclosure is not limited thereto.

The element separation layer STI may include, for example, at least one of silicon oxide (SiO2), silicon nitride (SiN), silicon carbide (SiC), silicon oxycarbide (SiOC), silicon oxynitride (SiON), and/or silicon oxycarbon nitride (SiOCN).

The reflection prevention layer 130 may be arranged on the first surface 120a of the substrate 120. The reflection prevention layer 130 may prevent or reduce reflection of light entering the inside of the substrate 120 from the first surface 120a of the substrate 120.

Although it is illustrated in FIG. 4 that the reflection prevention layer 130 is a single film, the present disclosure is not limited thereto. That is, in some embodiments, the reflection prevention layer 130 may be formed as a multi-film. In some embodiments, the reflection prevention layer 130 may be omitted.

The reflection prevention layer 130 may include a high-k dielectric material, for example, hafnium oxide (HfO$_2$), but the present disclosure is not limited thereto.

The first insulating layer 140 may be arranged on the reflection prevention layer 130. The first insulating layer 140 may be arranged to expose the reflection prevention layer 130 between the contacts 170. The first insulating layer 140 may include silicon oxide (SiO2), for example, but the present disclosure is not limited thereto.

The contact 170 may be arranged to penetrate through the first insulating layer 140 and the reflection prevention layer 130 in the third direction Z. A lower portion of the contact 170 may be extended into via 121. The contact 170 may be electrically connected with via 121.

Although it is illustrated in FIG. 4 that the contact 170 is formed as a single film, this is only for convenience of explanation, and thus the present disclosure is not limited thereto.

The contact 170 may include, for example, a contact conductive film and a contact barrier film. The contact barrier film may be formed along a sidewall and a bottom surface of a trench formed with the contact 170.

The contact barrier film may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and/or a combination thereof.

The contact conductive film may be arranged on the contact barrier film to fill or partially occupy the trench formed with the contact 170.

The contact conductive film may include, for example, at least one of titanium (Ti), titanium nitride (TiN) and tungsten (W), but the present disclosure is not limited thereto.

That is, in some embodiments, the contact conductive film may include, for example, at least one of carbon (C), silver (Ag), cobalt (Co), tantalum (Ta), indium (In), tin (Sn), zinc (Zn), manganese (Mn), magnesium (Mg), chromium (Cr), germanium (Ge), strontium (Sr), platinum (Pt), magnesium (Mg), aluminum (Al), or zirconium (Zr).

The liner layer 150 may be arranged along an upper surface of the reflection prevention layer 130 exposed from the first insulating layer 140, a sidewall of the first insulating layer 140, an upper surface of the first insulating layer 140, and/or a part of the sidewall of the contact 170 exposed on the upper surface of the first insulating layer 140. In this case, the liner layer 150 may not be arranged a sidewall of the upper portion of the contact 170.

The liner layer 150 may be conformally formed, for example, but the present disclosure is not limited thereto. The liner layer 150 may include silicon oxide (SiO2), for example, but the present disclosure is not limited thereto.

The color filter 180 may be arranged within the first insulating layer 140. Specifically, the color filter 180 may be arranged on the liner layer 150 between sidewalls of the first insulating layers 140. A sidewall and a lower surface of the color filter 180 may be in contact with the liner layer 150.

The color filter 180 may be arranged on at least one side of the contact 170. The color filter 180 may be spaced apart from the contact 170 in the first direction X.

An upper surface 180a of the color filter 180 may be formed to be lower than an upper surface of the first insulating layer 140. That is, the upper surface 180a of the color filter 180 may be formed closer to the first surface 120a of the substrate 120 than the upper surface of the first insulating layer 140. However, the present disclosure is not limited thereto.

The second insulating layer 160 may be arranged on the liner layer 150 and the color filter 180. An upper surface of the second insulating layer 160 may be formed on a same plane as an upper surface of the liner layer 150.

The second insulating layer 160 may include silicon oxide (SiO2), for example, but the present disclosure is not limited thereto.

The moisture absorption prevention layer 190 may be arranged on the second insulating layer 160 and the liner layer 150. The moisture absorption prevention layer 190 may be arranged to completely cover the second insulating layer arranged between adjacent contacts 170, and the liner layer 150.

The moisture absorption prevention layer 190 may be in contact with a sidewall of the contact 170 exposed on an upper portion of the liner layer 150. The moisture absorption prevention layer 190 may be extended on the upper surface 180a of the color filter 180. The moisture absorption prevention layer 190 may overlap the color filter 180 in the third direction Z.

The second insulating layer 160 may be between the color filter 180 and the moisture absorption prevention layer 190. At least a part of the moisture absorption prevention layer 190 may be between the first insulating layer 140 and the second insulating layer 160.

An upper surface 190a of the moisture absorption prevention layer 190 may be formed on a same plane as an upper surface 170a of the contact 170. A thickness t of the moisture absorption prevention layer 190 in the third direction Z may be uniform, in some embodiments.

The moisture absorption prevention layer 190 may include a material different from each of the first insulating layer 140, the liner layer 150, and the second insulating layer 160. The moisture absorption prevention layer 190 may include silicon oxycarbide (SiOC), for example. However, the present disclosure is not limited thereto. That is, in some embodiments, the moisture absorption prevention layer 190 may include, for example, at least one of aluminum oxide (Al$_2$O$_3$), silicon nitride (SiN), and silicon oxynitride (SiON).

The lower electrode 1010 may be on the contact 170 and the moisture absorption prevention layer 190. The lower electrode 1010 may be arranged to be in contact with the upper surface 170a of the contact 170. The lower electrode 1010 may be electrically connected with the contact 170.

The plurality of lower electrodes 1010 may be spaced apart from one another. Specifically, any one lower electrode 1010 electrically connected with any one contact 170 may be spaced apart from another lower electrode 1010 electrically connected with adjacent another contact 170.

The lower electrode 1010 may be a transparent electrode. The lower electrode 1010 may include at least one of indium tin oxide (ITO), zinc oxide (ZnO), tin dioxide (SnO2), antimony-doped tin oxide (ATO), aluminium-doped zinc oxide (AZO), gallium-doped zinc oxide (GZO), titanium dioxide (TiO2), fluorine-doped tin oxide (FTO), and/or a combination thereof.

The third insulating layer 1020 may be on the moisture absorption prevention layer 190. The third insulating layer 1020 may be between the lower electrodes 1010 spaced apart from each other.

The third insulating layer 1020 may include at least one of, for example, silicon oxide (SiO2), silicon nitride (SiN), silicon oxynitride (SiON), a low-k dielectric material, and/or a combination thereof.

The organic photoelectric conversion layer 1030 may be on the lower electrode 1010 and the third insulating layer 1020.

The organic photoelectric conversion layer 1030 may generate photo-charges in proportion to a quantity of light entering from the outside. That is, the organic photoelectric conversion layer 1030 may receive light and convert the light signal into an electric signal. The organic photoelectric conversion layer 1030 may correspond to the first organic photoelectric conversion element OPD1 of FIG. 2.

In some embodiments, the organic photoelectric conversion layer 1030 may detect light of a different wavelength from that of the photoelectric conversion element PD. For example, the organic photoelectric conversion layer 1030 may detect green light. For example, light of the green wavelength out of the light entering from the outside may be absorbed into the organic photoelectric conversion layer 1030. Accordingly, the organic photoelectric conversion layer 1030 may provide an electric signal corresponding the green light. Light of wavelengths other than green light may pass through the organic photoelectric conversion layer 1030.

In addition, in some embodiments, the photoelectric conversion element PD may detect red or blue light. For example, the light passing through the organic photoelectric conversion layer 1030 may pass through the color filter 180 and provide red light or blue light to the photoelectric conversion element PD. Accordingly, the photoelectric conversion element PD may provide an electric signal corresponding to red light or blue light, after filtering out the green light.

The upper electrode 1040 may be on the organic photoelectric conversion layer 1030. The upper electrode 1040 may be a transparent electrode. The upper electrode 1040 may include, for example, at least one of indium tin oxide (ITO), zinc oxide (ZnO), tin dioxide (SnO2), antimony-doped tin oxide (ATO), aluminium-doped zinc oxide (AZO), gallium-doped zinc oxide (GZO), titanium dioxide (TiO2), fluorine-doped tin oxide (FTO), and/or a combination thereof.

The upper electrode 1040 may include the same material as the lower electrode 1010, but the present disclosure is not limited thereto. That is, in some embodiments, the upper electrode 1040 may include a different material from the lower electrode 1010.

The protection layer 1050 may be on the upper electrode 1040. Although it is illustrated in FIG. 4 that the protection layer 1050 is formed as a single film, this is only for convenience of explanation, and thus the present disclosure is not limited thereto.

The protection layer 1050 may include, for example, a passivation layer, an insulating layer, and/or a planarization layer which are stacked on the upper electrode 1040 sequentially.

The passivation layer may include, for example, a high-k dielectric insulating material. At least a part of the high-k dielectric insulating material included in the passivation layer may have an amorphous structure. However, the present disclosure is not limited thereto.

For example, the planarization layer may include, for example, at least one of silicon oxide film-based material, silicon nitride film-based material, resin or a combination thereof.

The micro lens 1060 may be arranged on the protection layer 1050. The micro lens 1060 may have a convex shape and may have a predetermined radius of curvature. Accordingly, the micro lens 1060 may collect light entering the unit pixel region.

The micro lens 1060 may include, for example, an organic material such as light permeable resin, but the present disclosure is not limited thereto.

The image sensor, according to some embodiments, may have the moisture absorption prevention layer 190 arranged between the color filter 180 and the organic photoelectric conversion layer 1030 to prevent the organic photoelectric conversion layer 1030 from being degraded by a material provided from the color filter 180, thereby enhancing reliability of the image sensor.

A method for fabricating an image sensor according to some embodiments will be explained with reference to FIG. 4 and FIGS. 6 to 12.

FIGS. 6 to 12 are views illustrating intermediate stages of fabrication, provided to explain a method for fabricating an image sensor according to some embodiments.

Figure 6:
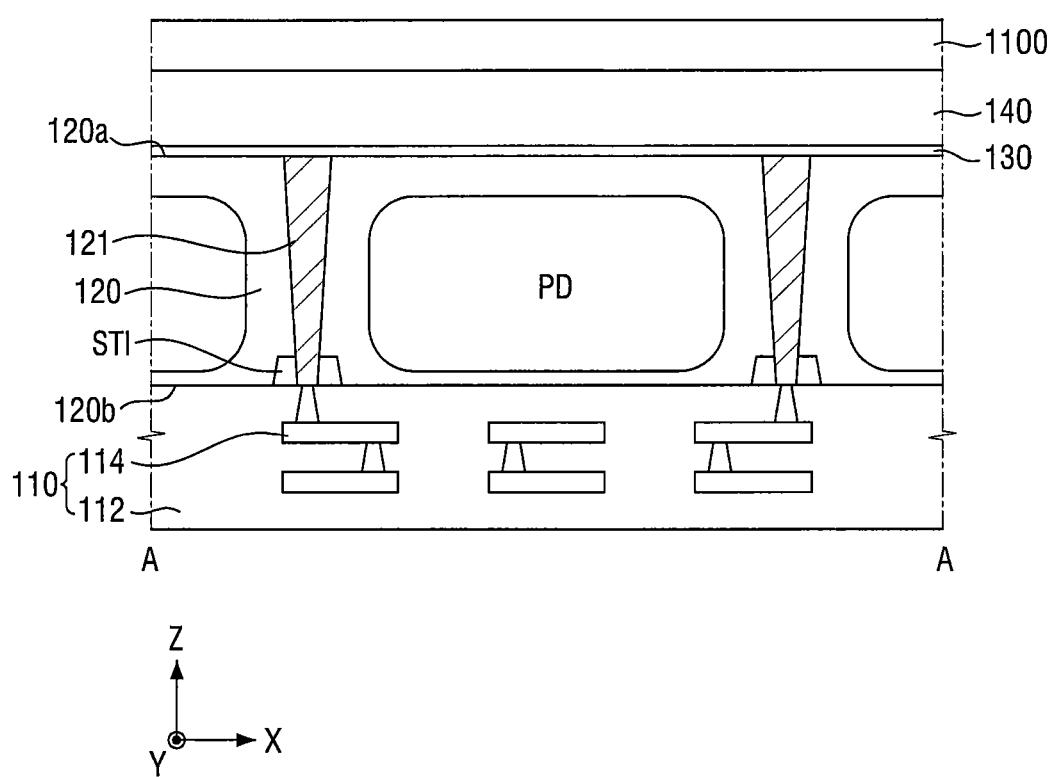
FIGS. 6 to 12 are views illustrating intermediate stages of fabrication, provided to explain a method for fabricating an image sensor according to some embodiments of the present disclosure.

Referring to FIG. 6, the substrate 120 and the insulating structure 110 formed on the second surface 120b of the substrate 120 may be provided.

The photoelectric conversion element PD, via 121, and the element separation layer STI may be formed in the substrate 120. The interlayer insulating film 112 and the plurality of wire layers 114 may be formed in the insulating structure 110.

Next, the reflection prevention layer 130, the first insulating layer 140, and a mask layer 1100 may sequentially be stacked on the first surface 120a of the substrate 120.

The mask layer 1100 may include, for example, silicon nitride (SiN), but the present disclosure is not limited thereto.

Figure 7:
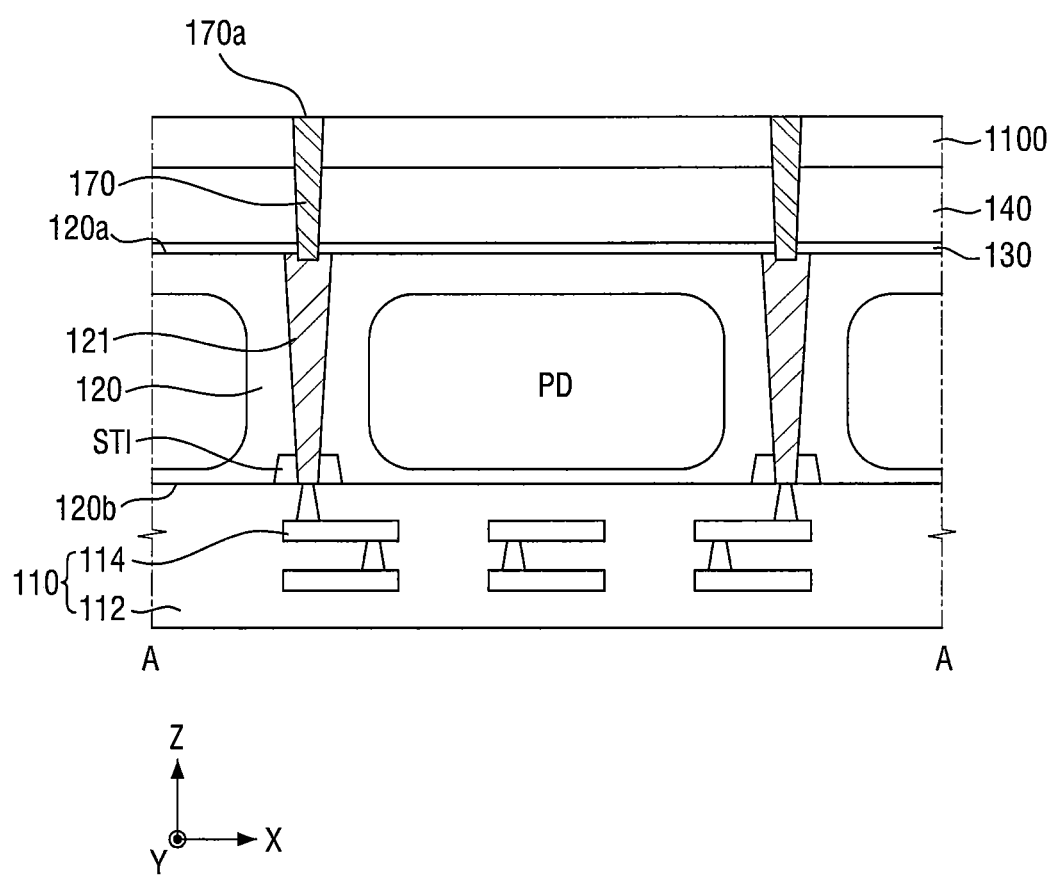

Referring to FIG. 7, an etching process may be performed to form a first trench penetrating through the reflection prevention layer 130, the first insulating layer 140, and the mask layer 1100 in the third direction Z and having a part extended within the via 121.

Next, the contact 170 may be formed in the first trench. The upper surface 170a of the contact 170 may be exposed on the mask layer 1100.

Figure 8:
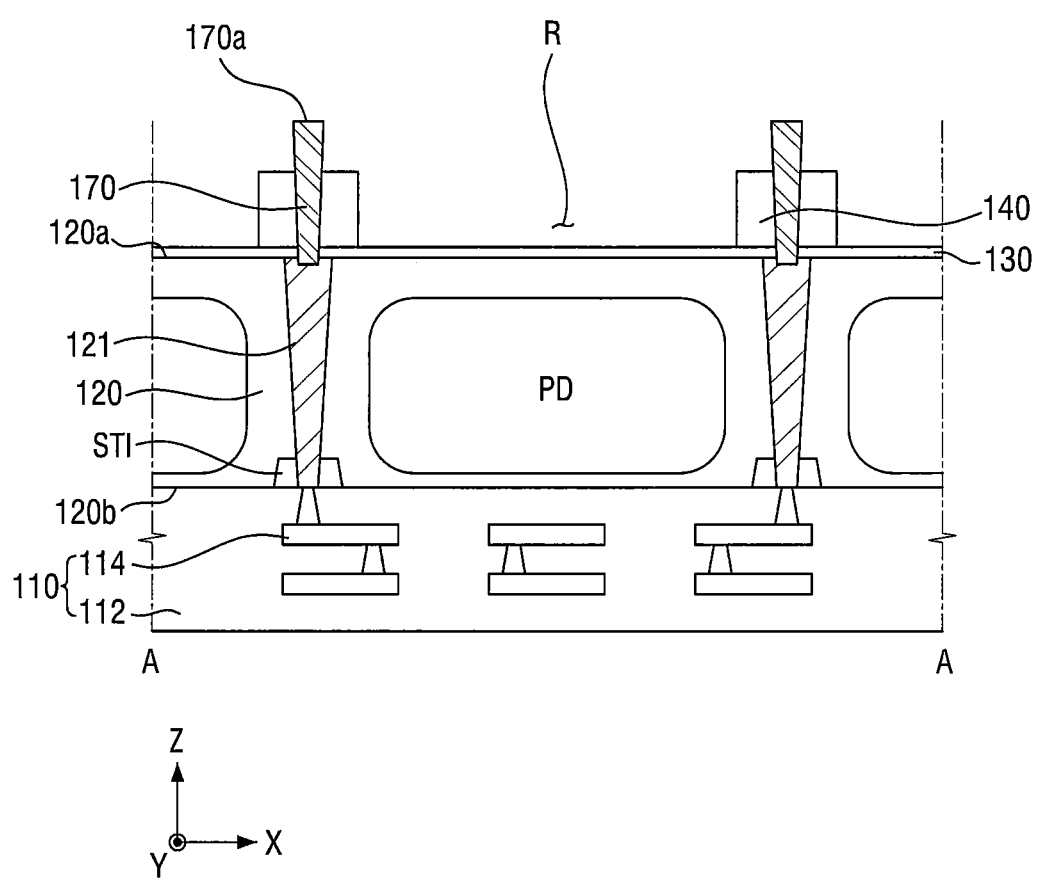

Referring to FIG. 8, a second trench R may be formed within the first insulating layer 140 by etching the mask layer 1100 and the first insulating layer 140. In this case, the reflection prevention layer 130 may be exposed through the second trench R.

The mask layer 1100 may then be removed.

Figure 9:
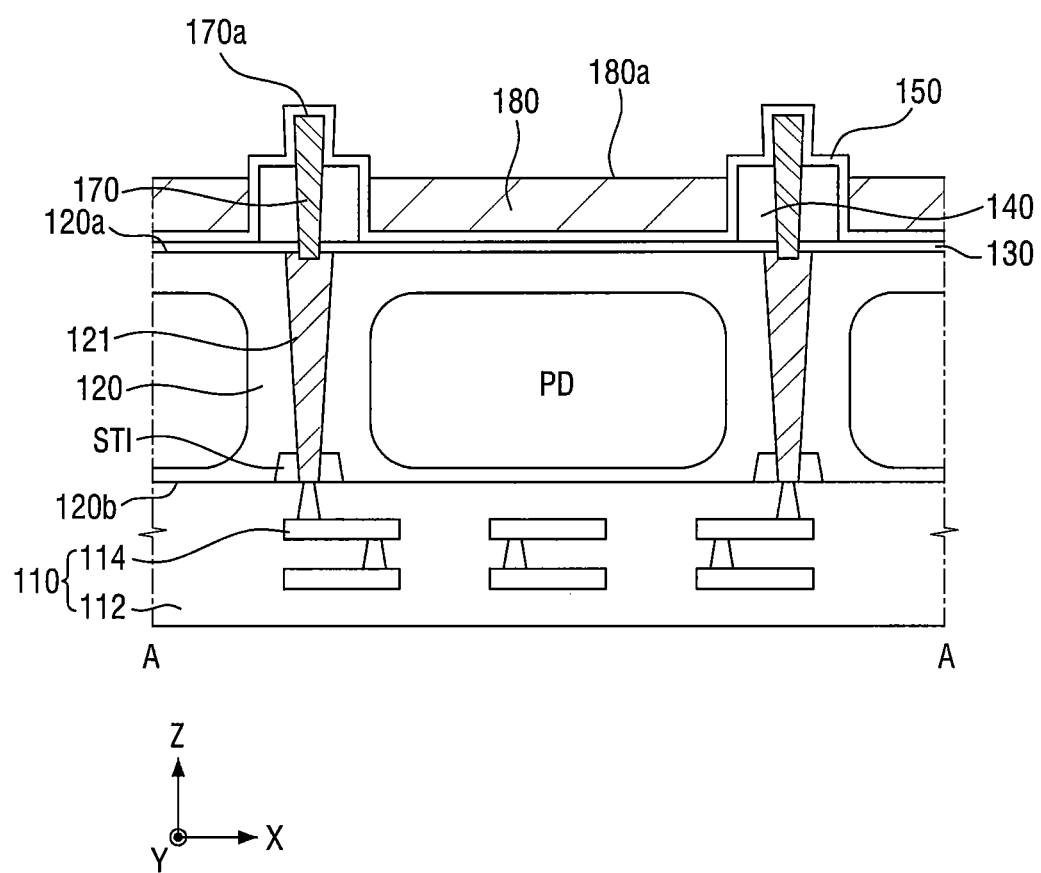

Referring to FIG. 9, the liner layer 150 may be formed on a bottom surface of the second trench R, a sidewall of the first insulating layer 140, an upper surface of the first insulating layer 140, and/or the contact 170 exposed on the upper surface of the first insulating layer 140. The liner layer 150 may be conformally formed, for example, but the present disclosure is not limited thereto.

The color filter 180 may then be formed within the second trench R. The color filter 180 may overlap a portion of the liner layer in the trench R. The upper surface 180a of the color filter 180 may be formed to be lower than the upper surface of the first insulating layer 140. However, the present disclosure is not limited thereto.

Figure 10:
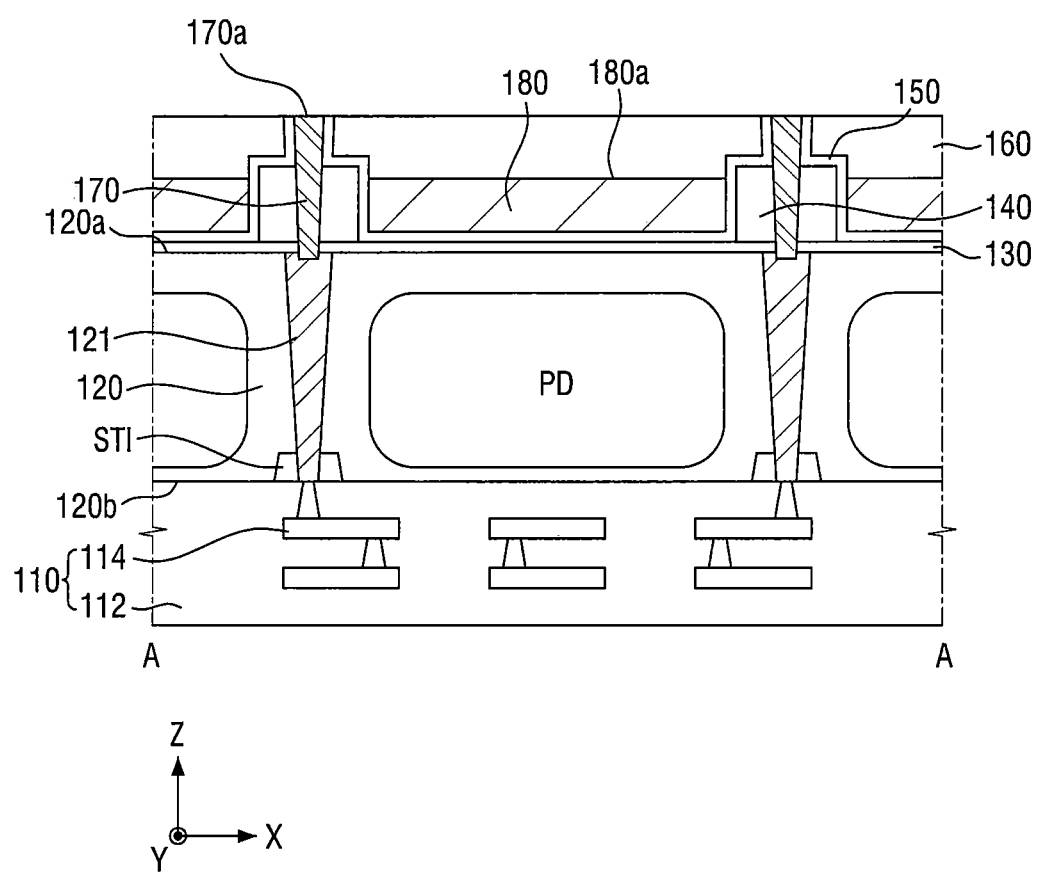

Referring to FIG. 10, the second insulating layer 160 may be formed to cover or overlap the liner layer 150 and the upper surface 180a of the color filter 180.

Next, through a planarization process (for example, a CMP process), the liner layer 150 formed on a part of the second insulating layer 160 and/or the upper surface 170a of the contact 170 may be removed. The upper surface 170a of the contact 170 may be exposed by the planarization process.

Figure 11:
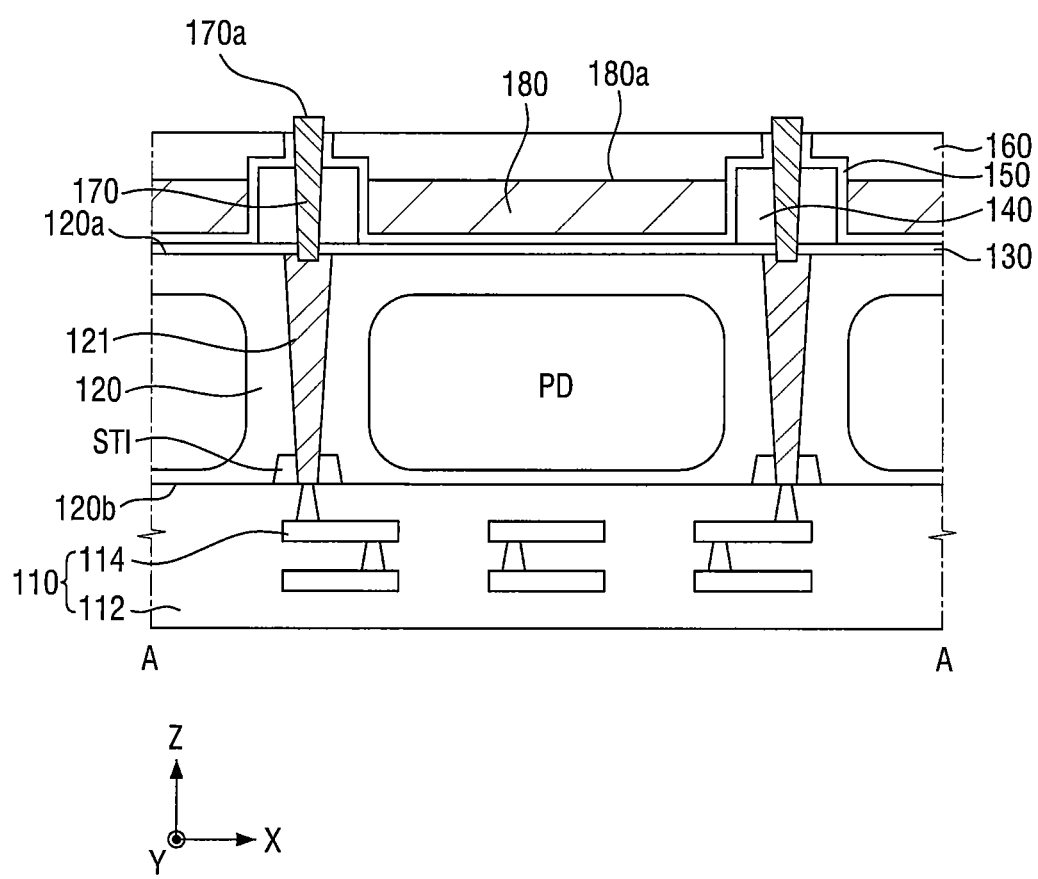

Referring to FIG. 11, through an etch back process, a part of the liner layer 150 formed on a part of the second insulating layer 160 and the sidewall of the upper portion of the contact 170 may be removed. Accordingly, a part of the sidewall of the upper portion of the contact 170 may be exposed.

Figure 12:
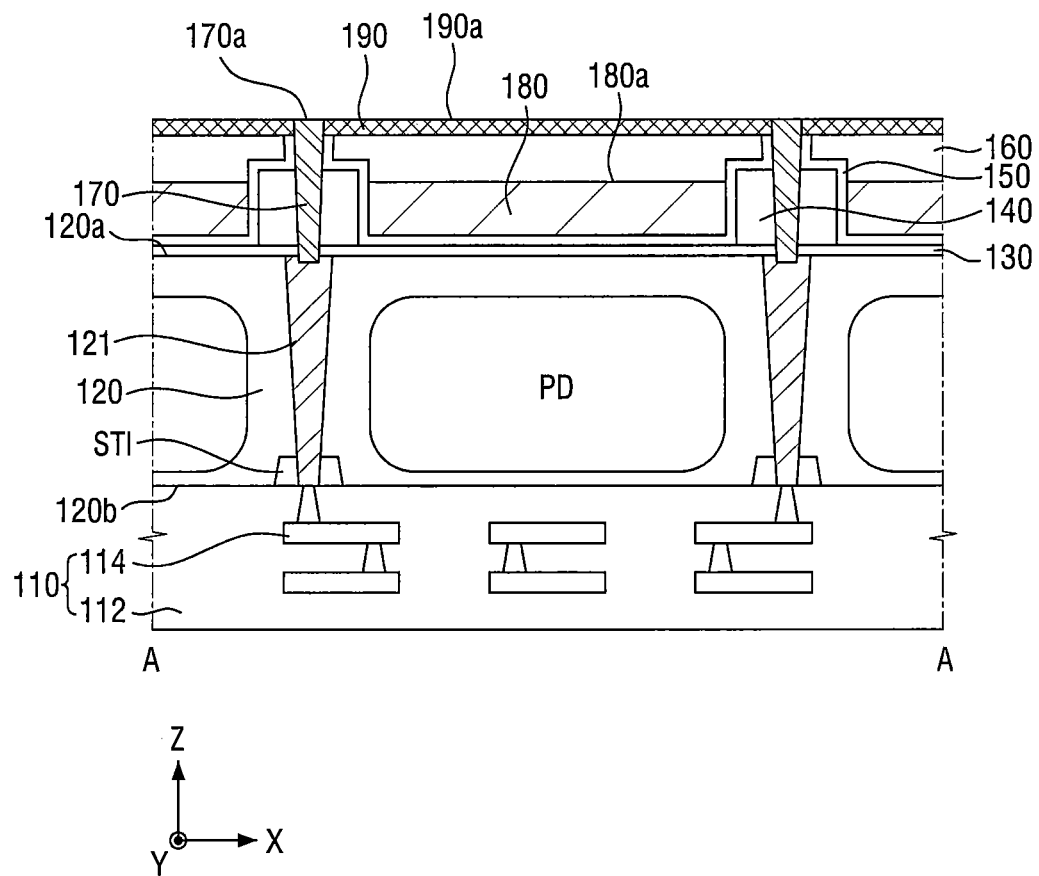

Referring to FIG. 12, the moisture absorption prevention layer 190 may be formed to cover or at least partially overlap the upper surface of the second insulating layer 160, the exposed liner layer 150, and/or the exposed contact 170.

Next, through a planarization process (for example, a CMP process), the upper surface 170a of the contact 170 may be exposed.

Referring to FIG. 4, the lower electrode 1010 may be formed on the upper surface 170a of the contact 170 and/or the upper surface 190a of the moisture absorption prevention layer 190. Further, the third insulating layer 1020 may be formed on the upper surface 190a of the moisture absorption prevention layer 190 on which the lower electrode 1010 is not formed. In this case, the upper surface of the lower electrode 1010 may be formed in the same plane as the upper surface of the third insulating layer 1020.

Next, the organic photoelectric conversion layer 1030, the upper electrode 1040, the protection layer 1050, and/or the micro lens 1060 may be sequentially formed on the lower electrode 1010 and/or the third insulating layer 1020.

Through the above-described processes, the image sensor illustrated in FIG. 4 may be fabricated.

An image sensor according to some embodiments will be described with reference to FIGS. 13 and 14. The description will be made with the main focus on the differences from the image sensor illustrated in FIGS. 4 and 5.

Figure 13:
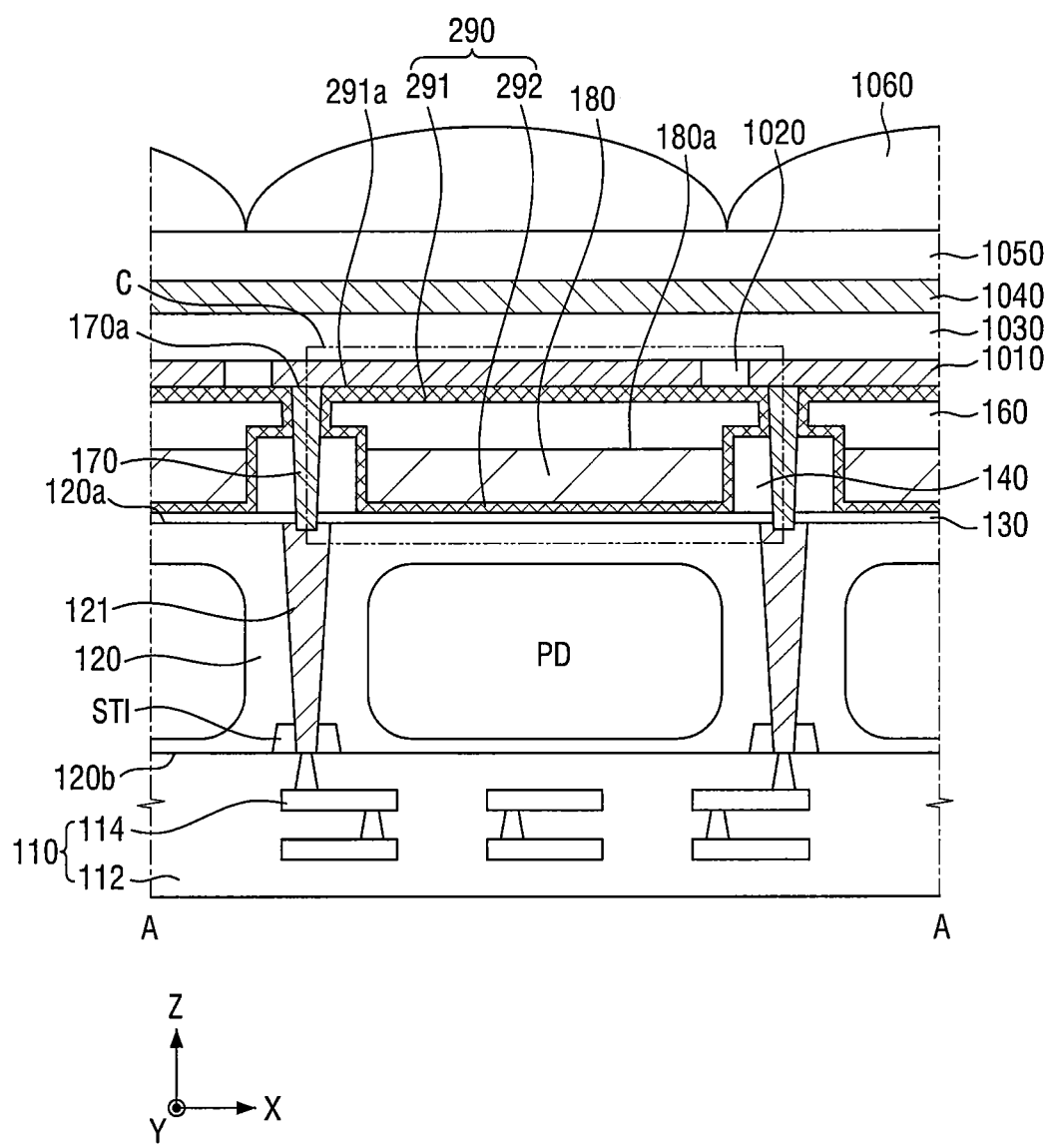
FIG. 13 is a cross-sectional view of an image sensor according to some embodiments of the present disclosure.

FIG. 13 is a cross-sectional view provided to explain an image sensor according to some embodiments. FIG. 14 is a view enlarging a section C of FIG. 13.

Figure 14:
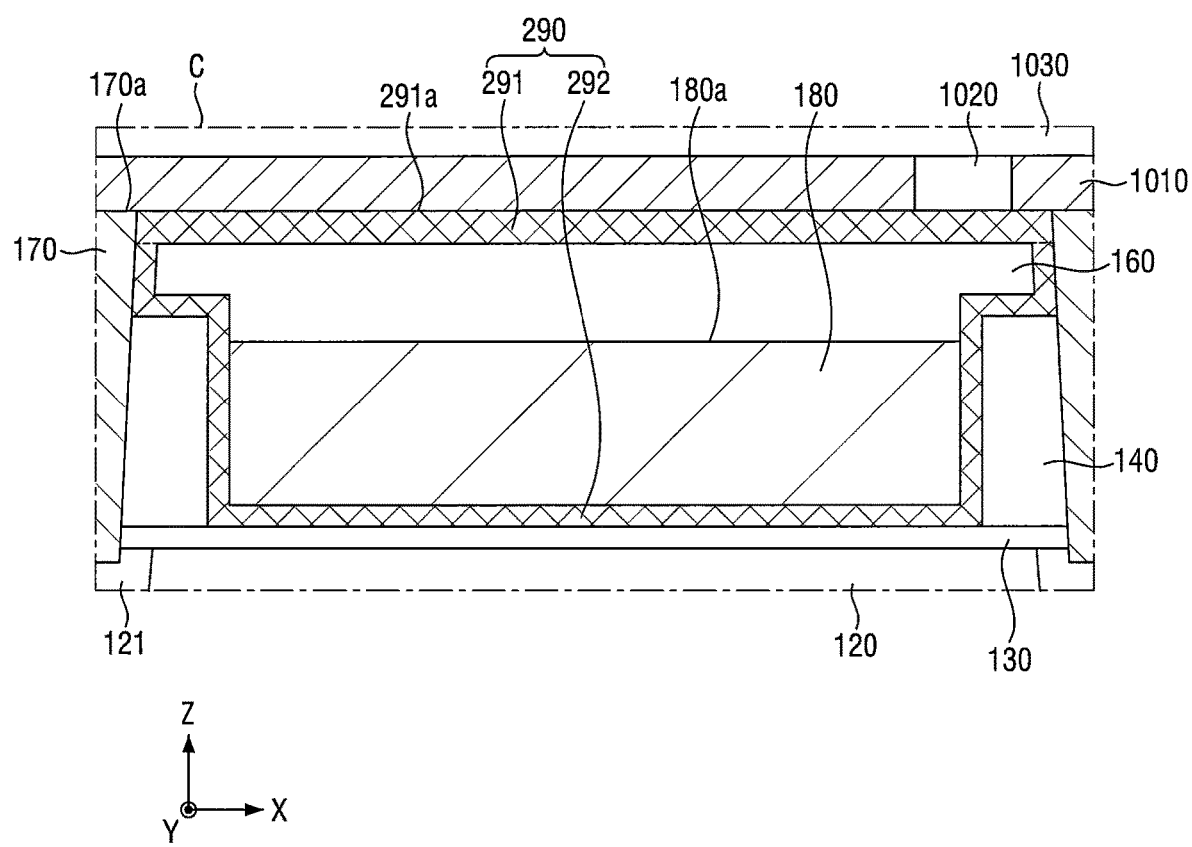
FIG. 14 is a view enlarging a section C of FIG. 13.

Referring to FIGS. 13 and 14, in the image sensor according to some embodiments, a moisture absorption prevention layer 290 includes a first portion 291 and a second portion 292.

Figure 17:
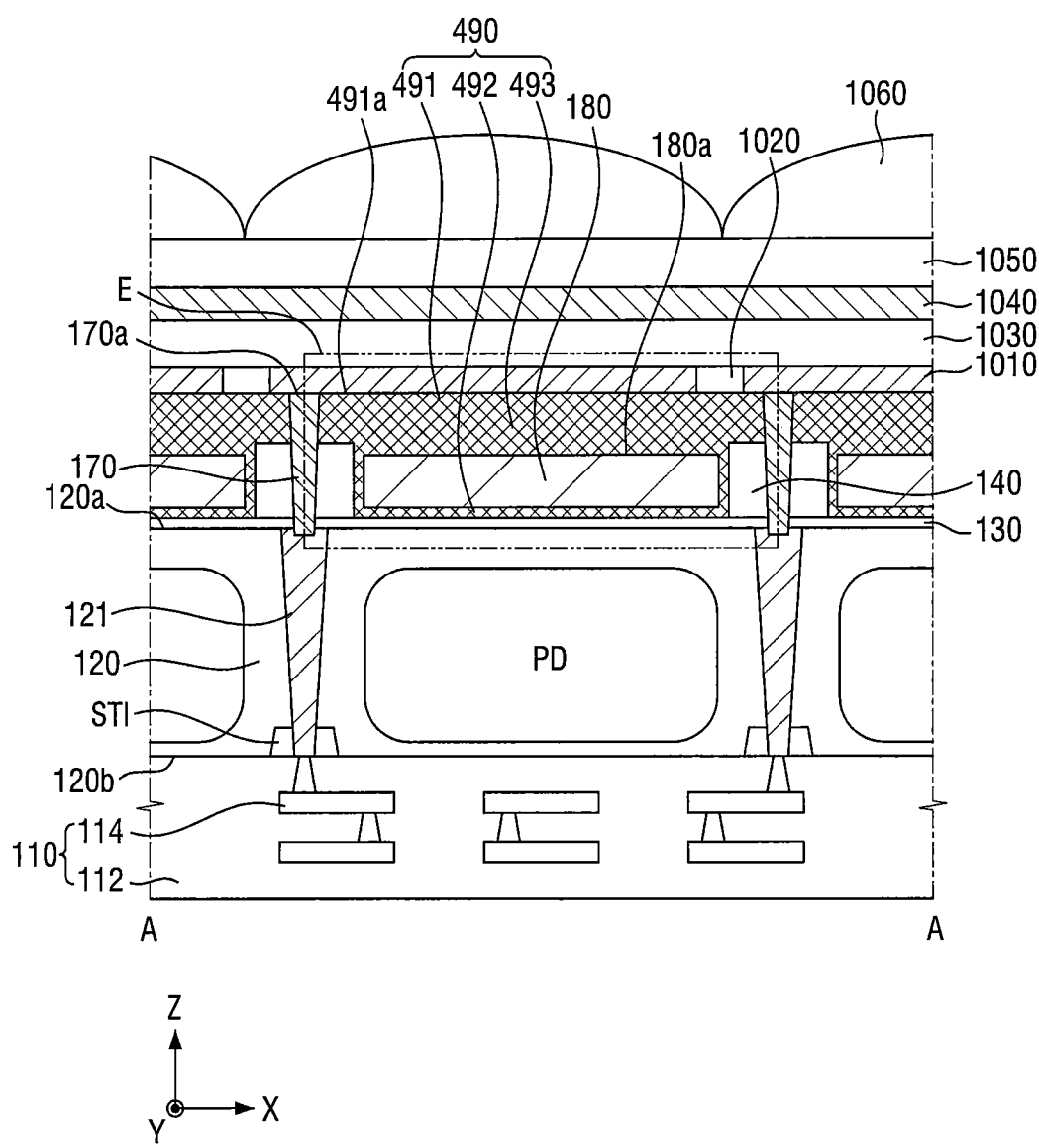
FIG. 17 is a cross-sectional view of an image sensor according to some embodiments of the present disclosure.
Figure 18:
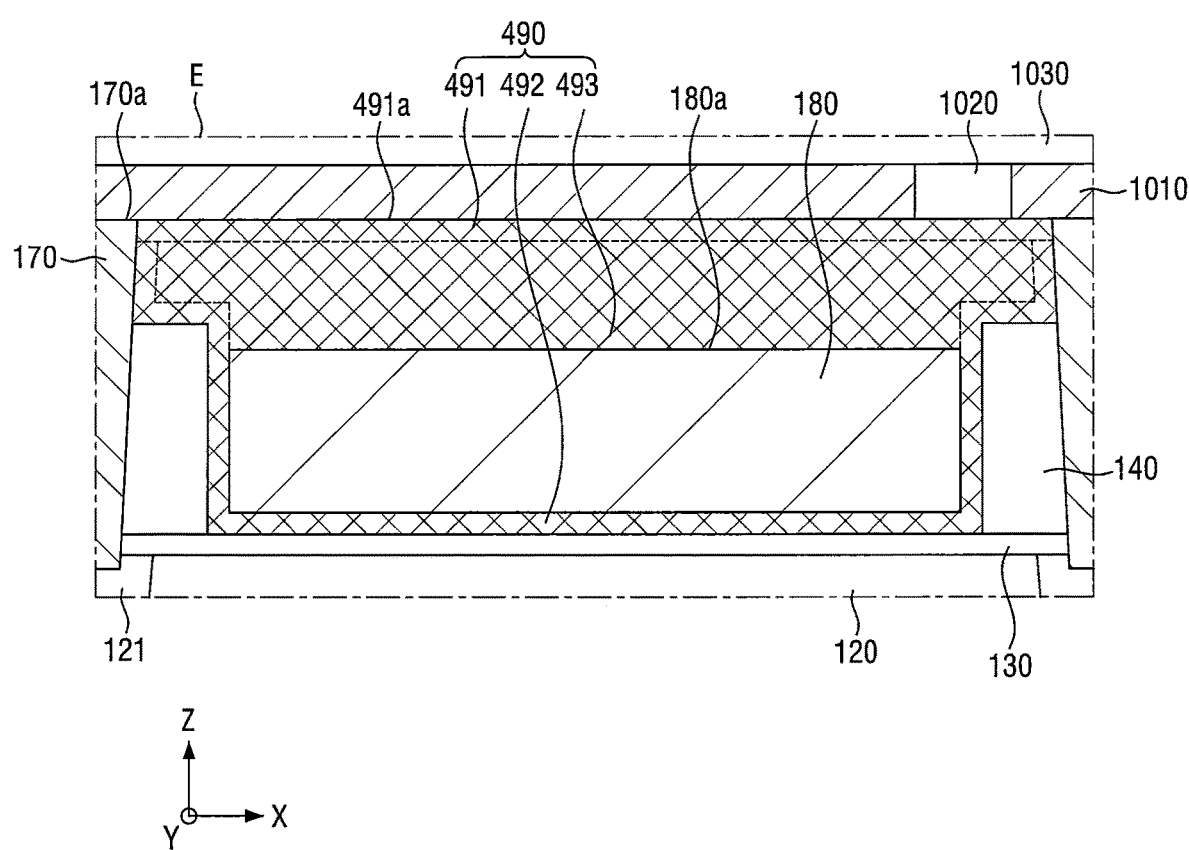
FIG. 18 is a view enlarging a section E of FIG. 17.

The first portion 291 of the moisture absorption prevention layer 290 may be in contact with a sidewall of the contact 170, and may be extended on the upper surface 180a of the color filter 180. In some embodiments, the upper surface 180a of the color filter 180 may be separated from the first portion 291 of the moisture absorption prevention layer 290 by the second insulating layer 160. However, in some embodiments, the upper surface 180a of the color filter 180 may be in contact with the first portion 291 of the moisture absorption prevention layer 290, such as illustrated in FIGS. 17 and 18. The first portion 291 of the moisture absorption prevention layer 290 may be extended along the bottom surface of the lower electrode 1010 and the bottom surface of the third insulating layer 1020.

The second insulating layer 160 may be between the first portion 291 of the moisture absorption prevention layer 290 and the upper surface 180a of the color filter 180. An upper surface 291a of the first portion 291 of the moisture absorption prevention layer 290 may be formed on a same plane as the upper surface 170a of the contact 170.

The second portion 292 of the moisture absorption prevention layer 290 may be arranged along an upper surface of the reflection prevention layer 130 exposed from the first insulating layer 140, a sidewall of the first insulating layer 140, an upper surface of the first insulating layer 140, and/or a part of the sidewall of the contact 170 exposed on the upper surface of the first insulating layer 140. That is, the second portion 292 of the moisture absorption prevention layer 290 may be arranged along the sidewall and the bottom surface of the color filter 180. The second portion 292 of the moisture absorption prevention layer 290 may be in contact with the sidewall and the bottom surface of the color filter 180.

The first portion 291 of the moisture absorption prevention layer 290 may be in contact with the second portion 292 of the moisture absorption prevention layer 290 on a sidewall of the contact 170 exposed on the first insulating layer 140.

The color filter 180 may be completely surrounded by the moisture absorption prevention layer 290 when viewed as a cross section in the X-Z plane.

An image sensor, according to some embodiments, will be described with reference to FIGS. 15 and 16. The description will be made with the main focus on the differences from the image sensor illustrated, in FIGS. 4 and 5.

Figure 15:
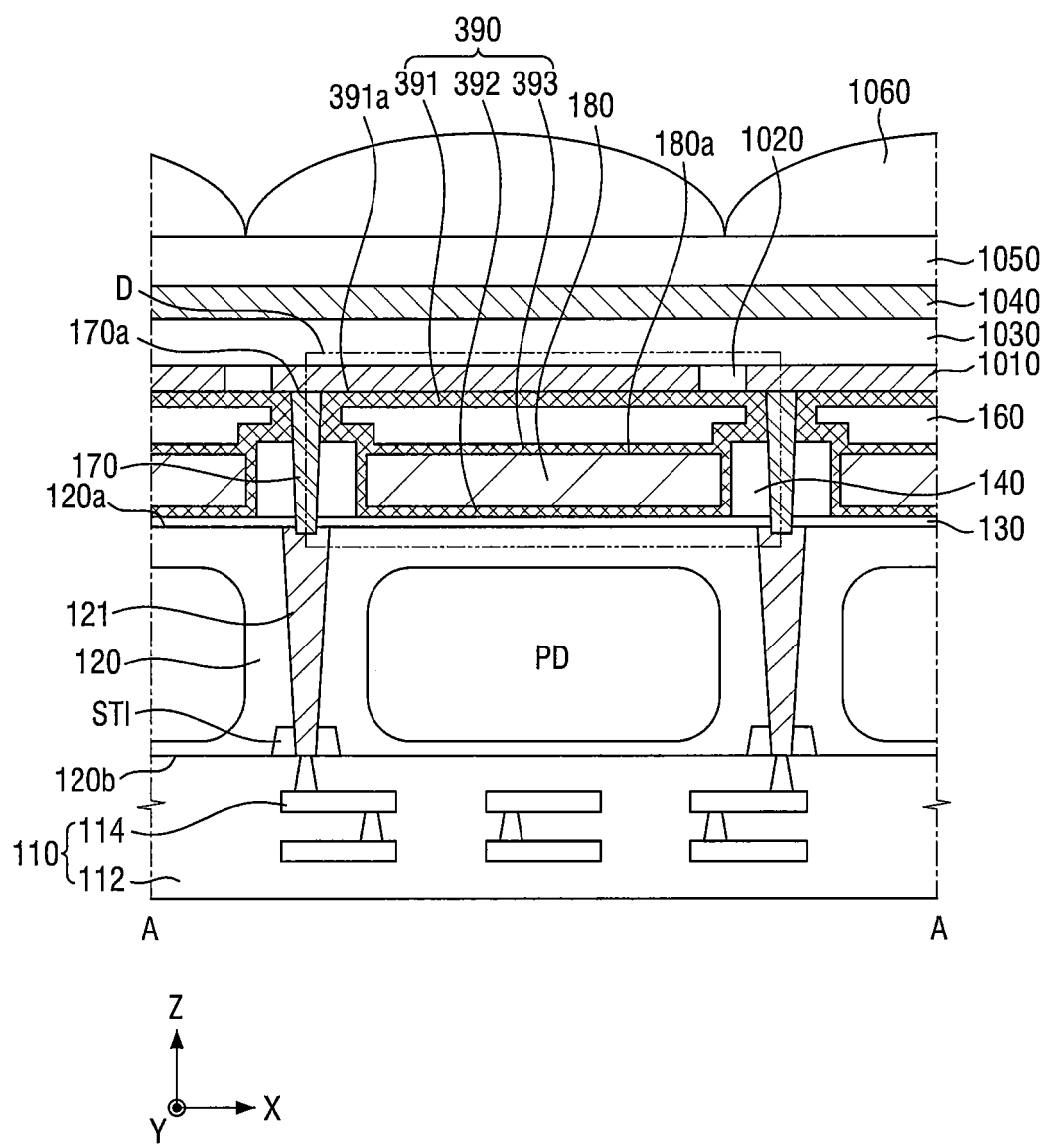
FIG. 15 is a cross-sectional view of an image sensor according to some embodiments of the present disclosure.

FIG. 15 is a cross-sectional view provided to explain an image sensor according to some embodiments. FIG. 16 is a view enlarging a section D of FIG. 15.

Figure 16:
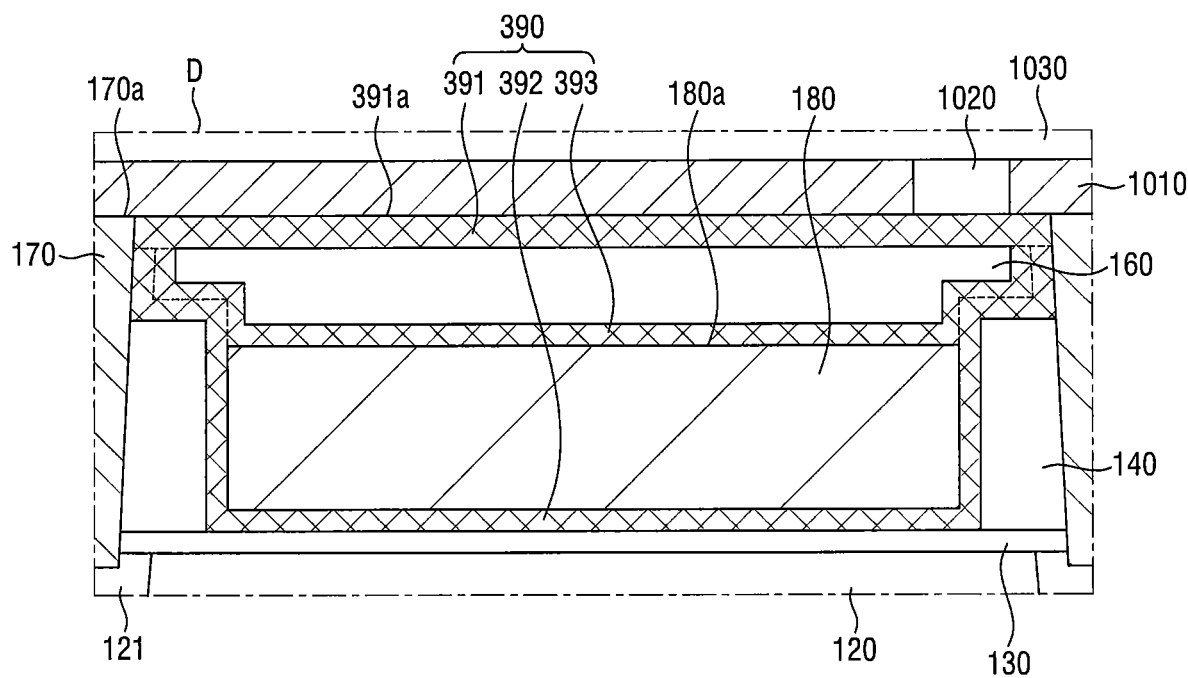
FIG. 16 is a view enlarging a section D of FIG. 15.

Referring to FIGS. 15 and 16, in the image sensor according to some embodiments, a moisture absorption prevention layer 390 includes a first portion 391, a second portion 392, and a third portion 393.

The first portion 391 of the moisture absorption prevention layer 390 may be in contact with a sidewall of the contact 170, and may be extended on the upper surface 180a of the color filter 180. The first portion 391 of the moisture absorption prevention layer 390 may be extended along the bottom surface of the lower electrode 1010 and the bottom surface of the third insulating layer 1020.

An upper surface 391a of the first portion 391 of the moisture absorption prevention layer 390 may be formed on a same plane as the upper surface 170a of the contact 170.

The second portion 392 of the moisture absorption prevention layer 390 may be arranged along an upper surface of the reflection prevention layer 130 exposed from the first insulating layer 140, a sidewall of the first insulating layer 140, an upper surface of the first insulating layer 140, and/or a part of the sidewall of the contact 170 exposed on the upper surface of the first insulating layer 140. That is, the second portion 392 of the moisture absorption prevention layer 390 may be arranged along the sidewall and the bottom surface of the color filter 180. The second portion 392 of the moisture absorption prevention layer 390 may be in contact with the sidewall and the bottom surface of the color filter 180.

The third portion 393 of the moisture absorption prevention layer 390 may be arranged along the upper surface 180a of the color filter 180 and the second portion 392 of the moisture absorption prevention layer 390 that is exposed on the upper surface 180a of the color filter 180.

The first portion 391 of the moisture absorption prevention layer 390 may be in contact with the second portion 392 of the moisture absorption prevention layer 390 on a sidewall of the contact 170 exposed on the first insulating layer 140. In addition, the first portion 391 of the moisture absorption prevention layer 390 may be in contact with the third portion 393 of the moisture absorption prevention layer 390 on a sidewall of the contact 170 exposed on the first insulating layer 140.

The second insulating layer 160 may be between the first portion 391 of the moisture absorption prevention layer 390 and the third portion 393 of the moisture absorption prevention layer 390.

The color filter 180 may be completely surrounded by the moisture absorption prevention layer 390 when viewed as a cross section in the X-Z plane.

An image sensor, according to some embodiments, will be described with reference to FIGS. 17 and 18. The description will be made with the main focus on the differences from the image sensor illustrated in FIGS. 4 and 5.

FIG. 17 is a cross-sectional view provided to explain an image sensor according to some embodiments. FIG. 18 is a view enlarging a section E of FIG. 17.

Referring to FIGS. 17 and 18, in the image sensor according to some embodiments, a moisture absorption prevention layer 490 includes a first portion 491, a second portion 492, and a third portion 493.

The first portion 491 of the moisture absorption prevention layer 490 may be in contact with a sidewall of the contact 170, and may be extended on the upper surface 180a of the color filter 180. The first portion 491 of the moisture absorption prevention layer 490 may be extended along the bottom surface of the lower electrode 1010 and the bottom surface of the third insulating layer 1020.

An upper surface 491a of the first portion 491 of the moisture absorption prevention layer 490 may be formed on a same plane as the upper surface 170a of the contact 170.

The second portion 492 of the moisture absorption prevention layer 490 may be arranged along an upper surface of the reflection prevention layer 130 exposed from the first insulating layer 140, a sidewall of the first insulating layer 140, an upper surface of the first insulating layer 140, and/or a part of the sidewall of the contact 170 exposed on the upper surface of the first insulating layer 140. That is, the second portion 492 of the moisture absorption prevention layer 490 may be arranged along the sidewall and the bottom surface of the color filter 180. The second portion 492 of the moisture absorption prevention layer 490 may be in contact with the sidewall and the bottom surface of the color filter 180.

The third portion 493 of the moisture absorption prevention layer 490 may be arranged in a region surrounded by the upper surface 180a of the color filter 180, the first portion 491 of the moisture absorption prevention layer 490, and the second portion 492 of the moisture absorption prevention layer 490, when viewed as a cross section in the X-Z plane. The third portion 493 of the moisture absorption prevention layer 490 may be in contact with the upper surface 180a of the color filter 180, the first portion 491 of the moisture absorption prevention layer 490, and the second portion 492 of the moisture absorption prevention layer 490, respectively.

The first portion 391 of the moisture absorption prevention layer 390 may be in contact with the second portion 392 of the moisture absorption prevention layer 390 on a sidewall of the contact 170 exposed on the first insulating layer 140. In addition, the first portion 391 of the moisture absorption prevention layer 390 may be in contact with the third portion 393 of the moisture absorption prevention layer 390 on the upper surface 180a of the color filter 180 and on the second portion 392 of the moisture absorption prevention layer 390.

The color filter 180 may be completely surrounded by the moisture absorption prevention layer 490 when viewed as a cross section in the X-Z plane.

Embodiments according to the present disclosure were explained hereinabove with reference to the drawings attached, but it should be understood that the present disclosure is not limited to the aforementioned embodiments, but may be fabricated in various different forms, and may be implemented by a person skilled in the art in other specific forms without altering the technical concept or essential characteristics of the present disclosure. Accordingly, it will be understood that the embodiments described above are only illustrative, and should not be construed as limiting.

What is claimed is:

1. An image sensor, comprising:
a substrate comprising a photoelectric conversion element therein;
a first insulating layer on the substrate;
a contact penetrating through the first insulating layer;
a color filter on at least one side of the contact; and
a moisture absorption prevention layer in contact with a sidewall of the contact and overlapping an upper surface of the color filter; and
a reflection prevention layer between the substrate and the color filter, and
an organic photoelectric conversion layer on the moisture absorption prevention layer,
wherein the moisture absorption prevention layer is not in contact with the substrate and not in contact with the organic photoelectric conversion layer, and
wherein the moisture absorption prevention layer comprises a first portion over lapping the upper surface of the color filter, and a second portion along a sidewall of the color filter and along a bottom surface of the color filter.

2. The image sensor of claim 1, wherein the moisture absorption prevention layer completely surrounds the color filter in a cross-sectional view of the image sensor.

3. The image sensor of claim 1, wherein the moisture absorption prevention layer comprises a different material from a material of the first insulating layer.

4. The image sensor of claim 1, wherein an upper surface of the contact is in a same plane as an upper surface of the moisture absorption prevention layer.

5. The image sensor of claim 1, wherein the moisture absorption prevention layer has a uniform thickness.

6. The image sensor of claim 1, wherein the moisture absorption prevention layer comprises SiOC.

7. The image sensor of claim 1, wherein the moisture absorption prevention layer further comprises a third portion along the upper surface of the color filter.

8. The image sensor of claim 7, further comprising:
a second insulating layer between the first portion of the moisture absorption prevention layer and the third portion of the moisture absorption prevention layer, wherein the second insulating layer comprises a different material from a material of the moisture absorption prevention layer.

9. The image sensor of claim 8,
wherein the first portion of the moisture absorption prevention layer is in contact with the third portion of the moisture absorption prevention layer,
wherein the contact comprises a first contact,
wherein a lower portion of the second insulating layer that is between the first contact and a second contact is directly on the third portion of the moisture absorption prevention layer,
wherein an upper portion of the second insulating layer is in contact with the first portion of the moisture absorption prevention layer, and
wherein a first width of the lower portion of the second insulating layer is less than a second width of the upper portion of the second insulating layer.

10. An image sensor, comprising:
a substrate comprising a photoelectric conversion element therein;
a color filter on the substrate;
a lower electrode overlapping the color filter;
a contact arranged on at least one side of the color filter and in contact with the lower electrode;
a moisture absorption prevention layer in contact with a sidewall of the contact and extending along a bottom surface of the lower electrode;
a first insulating layer that surrounds the sidewall of the color filter in a cross-sectional view of the image sensor;
a second insulating layer on the first insulating layer and the color filter; and
an organic photoelectric conversion layer on the lower electrode,
where in at least a portion of the moisture absorption prevention layer is between the first insulating layer and the second insulating layer,
wherein the moisture absorption prevention layer is not in contact with the substrate and not in contact with the organic photoelectric conversion layer, and
wherein the moisture absorption prevention layer comprises a first portion extending along the bottom surface of the lower electrode, and a second portion along a sidewall of the color filter and along a bottom surface of the color filter.

11. The image sensor of claim 10, wherein an upper surface of the contact is in a same plane as an upper surface of the moisture absorption prevention layer.

12. The image sensor of claim 10, further comprising:
wherein the at least the portion of the moisture absorption prevention layer is in contact with the first insulating layer and the second insulating layer.

13. The image sensor of claim 12, wherein each of the first insulating layer and the second insulating layer comprises a different material from a material of the moisture absorption prevention layer.

14. The image sensor of claim 13,
wherein each of the first insulating layer and the second insulating layer comprises $SiO_2$, and
wherein the moisture absorption prevention layer comprises SiOC.

15. An image sensor comprising:
a substrate comprising a first surface and a second surface opposing each other, wherein the substrate comprises a photoelectric conversion element therein;
an insulating structure on the second surface of the substrate and comprising a plurality of wire layers;
a via penetrating through the substrate;
a first insulating layer on the first surface of the substrate;
a color filter in the first insulating layer;
a contact on at least one side of the color filter, penetrating through the first insulating layer, and configured to electrically connect with the via;
a moisture absorption prevention layer in contact with a sidewall of the contact, and extending on an upper surface of the color filter, wherein the moisture absorption prevention layer comprises a different material from a material of the first insulating layer;
a lower electrode on a top surface of the moisture absorption prevention layer and electrically connected with the contact;
an organic photoelectric conversion layer on the lower electrode and separated from the moisture absorption prevention layer;
an upper electrode on the organic photoelectric conversion layer;
a protection layer on the upper electrode; and
a micro lens on the protection layer,
wherein an upper surface of the contact is in a same plane as an upper surface of the moisture absorption prevention layer,
wherein the moisture absorption prevention layer is not in contact with the substrate, and not in contact with the organic photoelectric conversion layer, and
wherein the moisture absorption prevention layer comprises a first portion extending on the upper surface of the color filter, and a second portion extending along a sidewall of the color filter and along a bottom surface of the color filter.

16. The image sensor of claim 15, further comprising:
a second insulating layer between the first portion of the moisture absorption prevention layer and the upper surface of the color filter,
wherein the second insulating layer comprises a different material from a material of the moisture absorption prevention layer.

* * * * *